United States Patent [19]

Wagner et al.

[11] Patent Number: 4,876,225

[45] Date of Patent: Oct. 24, 1989

[54] CANTILEVERED DIFFUSION CHAMBER ATMOSPHERIC LOADING SYSTEM AND METHOD

[75] Inventors: Edward A. Wagner, Alamo; Harold C. Guiver, Benlomond, both of Calif.

[73] Assignee: Berkeley Quartz Lab, Inc., Pleasanton, Calif.

[21] Appl. No.: 282,384

[22] Filed: Dec. 9, 1988

Related U.S. Application Data

[63] Continuation of Ser. No. 51,844, May 18, 1987, abandoned.

[51] Int. Cl.$^4$ .................. F16B 39/24; F27D 3/00; F27D 5/00
[52] U.S. Cl. .................. 437/248; 414/152; 432/9; 432/11
[58] Field of Search .......... 432/5, 6, 9, 11, 19, 432/23, 26, 152, 253; 414/152, 154, 210; 437/248; 29/569.1

[56] References Cited

U.S. PATENT DOCUMENTS

| | | | |
|---|---|---|---|
| 3,183,130 | 5/1965 | Reynolds et al. | 437/160 |
| 3,493,220 | 2/1970 | Kadgis et al. | 432/5 |
| 3,737,282 | 6/1973 | Hearn et al. | 437/247 |
| 4,129,090 | 12/1978 | Inaniwa et al. | 437/925 X |
| 4,439,146 | 3/1984 | Sugita | 432/253 |
| 4,523,885 | 6/1985 | Bayne et al. | 414/156 |
| 4,526,534 | 7/1985 | Wollmann | 432/11 |
| 4,543,059 | 9/1985 | Whang et al. | 432/11 |
| 4,610,628 | 9/1986 | Mizushina | 432/241 |
| 4,613,305 | 9/1986 | Sakurai | 432/253 |
| 4,624,638 | 11/1986 | Sarkozy | 432/253 |
| 4,669,938 | 6/1987 | Hayward | 414/156 |
| 4,699,084 | 10/1987 | Wilson et al. | 118/725 |
| 4,721,424 | 1/1988 | Aldridge et al. | 414/182 |
| 4,767,251 | 8/1988 | Whang | 414/147 |

Primary Examiner—Olik Chaudhuri
Attorney, Agent, or Firm—Majestic, Parsons, Siebert & Hsue

[57] ABSTRACT

A system and method for loading and unloading articles, especially adapted for moving semiconductor wafers into and out of a diffusion chamber. An article support is cantilevered for moving the articles into the chamber without touching it. A separately controllable cantilvered enclosure is provided for movement over the supported wafers when necessary for protection during the loading and/or unloading procedure. An inert gas controllably flows into the enclosure to provide a controlled atmosphere for the wafers during the loading and/or unloading procedure.

10 Claims, 2 Drawing Sheets

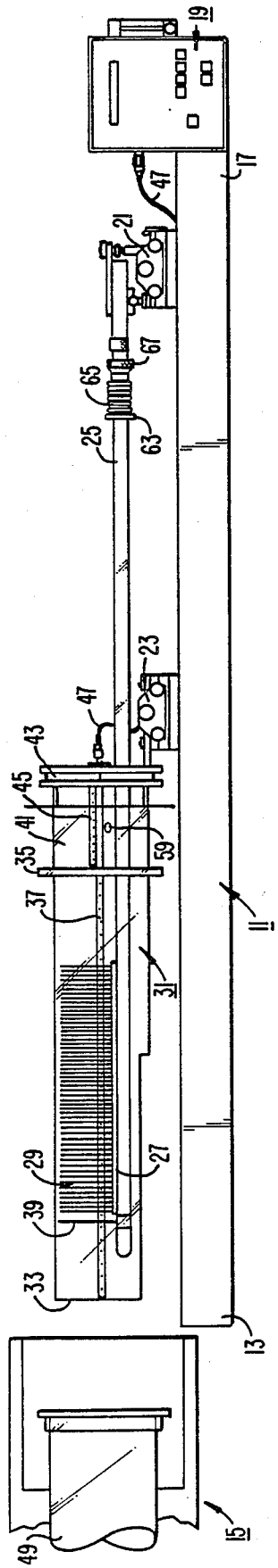
FIG._1.
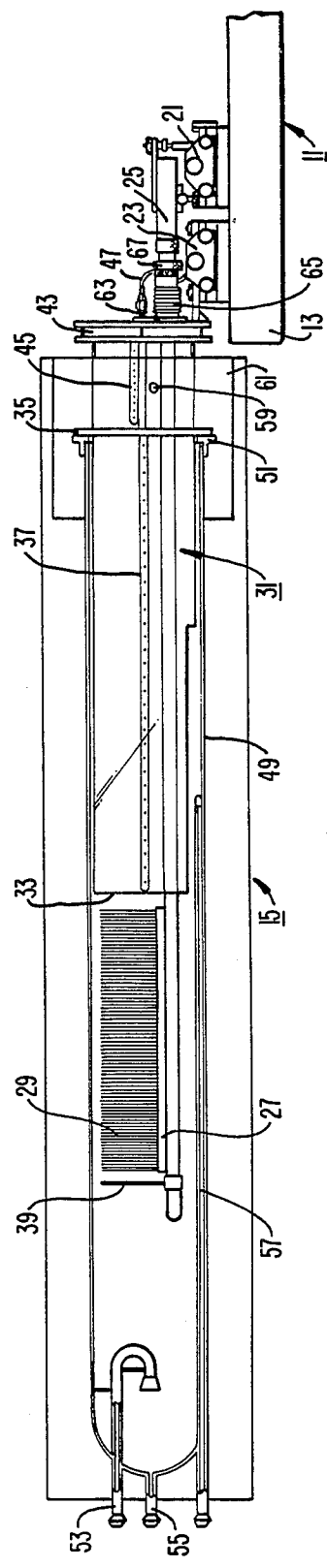
FIG._2.

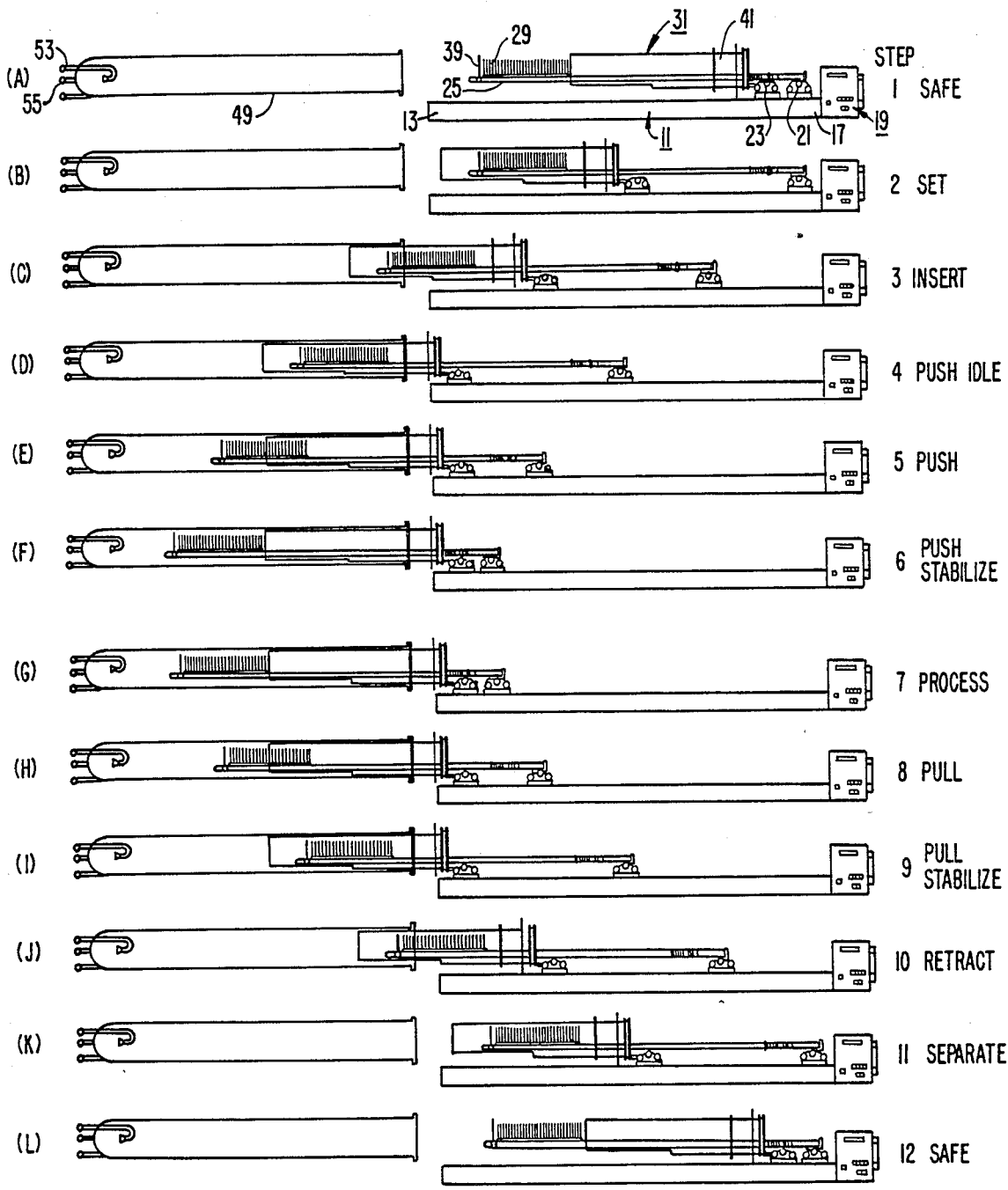
FIG._3.

CANTILEVERED DIFFUSION CHAMBER ATMOSPHERIC LOADING SYSTEM AND METHOD

This is a continuation of application Ser. No. 051,844, filed May 18, 1987, now abandoned.

BACKGROUND OF THE INVENTION

This invention relates generally to a system and method for loading articles into a reaction chamber for processing and for removing the articles from the chamber. More specifically, a primary application of the system and method of the present invention is the loading and unloading of semiconductor wafers from reaction chambers of diffusion furnaces.

An elongated semiconductor processing diffusion chamber is typically positioned horizontally. After a number of wafers are loaded into the chamber, it is purged by flowing an inert gas into one end of the chamber and out of an exhaust port (or ports) at another end. The wafers are heated by a suitable process, such as convection heating or radio frequency induced heating. When the wafers are at a desired temperature, two or more reactive gases are then introduced into the diffusion chamber. Those gases react on the hot surfaces of the wafers to form the desired film of material on the wafers. The completed wafers are then removed from the chamber and allowed to return to ambient temperature.

The semiconductor wafers are typically loaded into boats in a manner to be held upright and parallel to each other with small spaces between them. Because the generation of wafer contaminating particles must be avoided, the wafer boats are usually moved into and out of the reaction chamber by equipment that does so very precisely. The most popular type of such equipment positions the wafer holding boats at one end of an elongated support that is held at and moved from only its other end. The wafers are then moved into and out of the chamber, and held therein during processing, by a cantilevered support. Undesirable generation of particulate material is avoided by the cantilevered loaders as a result of avoiding contact between the loading/unloading system and the inside walls of the diffusion furnace reaction chamber.

More recently, as disclosed in U.S. Pat. No. 4,526,534, a partial enclosure in the form of a tube is attached to the elongated cantilevered support to surround the wafers at all times during the loading, unloading and processing operations. An inert gas is provided for flowing into this chamber during withdrawal of the heating wafers from the diffusion chamber. The wafers are maintained in such an inert atmosphere until they are cooled and no longer can be damaged by unwanted oxidation or particles. Such damage can occur if the heated wafers are exposed to air.

It is a primary object of the various aspects of the present invention to provide an improved atmospherically controlled cantilevered particle loading/unloading apparatus and method.

SUMMARY OF THE INVENTION

Briefly, according to one general aspect of the present invention, a loading system is provided with an elongated cantilevered article support and an atmospheric control enclosure surrounding a portion of the length of the support, each of the support and enclosure being independently movable with respect to each other and into and out of a diffusion chamber of a processing furnace. Each relative movement between the article support and the enclosure is provided so that the enclosure may be removed from the area of the elongated support upon which the semiconductor wafers or other articles being processed are held. This selective covering and uncovering of the articles may be done inside the reaction chamber as well as outside of it. On the outside of the reaction chamber, such movement allows ease of positioning the wafers on the support before processing and removing them from the support after processing. When inside the reaction chamber, the ability to effect such movement allows the articles to be processed in a position outside of the enclosure so that the enclosure does not interfere with the normal, designed furnace operation.

According to another aspect of the present invention, the wafers are positioned within the protective enclosure during both the loading and unloading steps, and an inert gas is caused to flow into the enclosure during both the loading and unloading steps. The addition of inert gas purging of the wafers within the enclosure during their loading into a reaction chamber provides protection of the wafers while they are being heated. This also allows the wafers to be uniformly and more controllably heated upon first entering the reaction chamber.

According to yet another aspect of the present invention, the enclosure may be provided in two parts, wherein an end of the enclosure furthest removed from its free, cantilevered end is provided with a separate enclosed purging chamber. This separate chamber has its own independently controlled source of inert gas. It provides a further isolation of the wafers from the ambient surroundings during loading, processing and unloading operations.

Additional objects, features and advantages of the various aspects of the present invention will become apparent from the following description of a preferred embodiment thereof, which description should be read in conjunction with the accompanying drawings.

BRIEF DESCRIPTION OF THE DRAWINGS

FIG. 1 is a side view of a semiconductor loading/unloading system with its moveable parts in one position outside a reaction chamber of a diffusion furnace;

FIG. 2 is a side view of the loading/unloading system of FIG. 1 with its moveable parts shown in another position and inside a reaction chamber; and FIG. 3 schematically illustrates, in separate views (A) through (L), different positions of the moveable parts of the loading/unloading system of FIGS. 1 and 2 in an example sequence of operational steps.

DESCRIPTION OF A PREFERRED EMBODIMENT

As best illustrated in FIG. 1, the main components will be described for the example article loading/unloading system illustrated in the drawings. The system described is for loading and unloading semiconductor wafers from reaction chambers of diffusion furnaces, but it will be understood that the principles embodied in this example system may also be utilized for loading and unloading other articles from reaction chambers or other types of receptacles.

An elongated frame 11 extends from one end 13, adapted to be positioned adjacent a diffusion furnace 15, and another end 17, which is connected to a system controller 19. The frame 11 contains for carrying two carriages 21 and 23 in a manner to move the carriages in a controlled way along the length of the frame 11.

The carriage 21 has attached to it one end of an elongated support for the articles to be loaded and unloaded. The elongated support is preferably a single paddle or a pair of rods. In the example being described, this support is in the form of a pair of rods, a rod 25 and another rod (not shown) behind rod 25 and parallel therewith. These rods are spaced apart a distance to hold a number of boats, such as a boat 27, which holds a plurality of semiconductor wafers upright and parallel with each other. The support rods are attached to the carriage 21 in a manner to be cantilevered out away from it and held in a position substantially parallel with that of the elongated frame member 11. This requires, of course, an attachment of the support rods with their carriage 21 that resists the large moment forces that exist. Preferably, this interconnection is provided with adjustments for precisely setting the angle at which the rods extend out from the carriage.

The second carriage 23 carries an enclosure 31 with a similar type of cantilevered connection. The enclosure 31 is preferably a tube that is open at an end 33 and that is adapted to enter the diffusion furnace 15. Another end of the tubular enclosure 31 is closed by a baffle 35. However, since the article support rods 25 must extend through the baffle 35, there are holes in the baffle sufficiently larger than the cross-sectional dimensions of supports rods 25 so that there can be movement between them without any touching or scraping. These openings are preferably round, square or oval in shape, depending upon the cross-sectional shape of the support. Such scraping is highly undesirable since it generates particles that can damage the articles being processed. An elongated tube 37 is positioned within the enclosure 31 on one side of the baffle 35 and contains holes along its length through which an inert gas, such as nitrogen, is introduced within the enclosure. The purpose of this structure is to provide a controlled atmosphere for the wafers within the enclosure 31. A removable baffle 39 is carried by the free end of the support rods 25 and helps to close off the open end 33 of the enclosure 31. Of course, there are still significant gaps through which gases may travel since the baffle 39 must be made small enough with respect to the interior dimensions of the enclosure 31 so that any touching or scraping between them is avoided as they are given relative motion.

In order to further isolate the wafers from outside conditions, another chamber 41 is provided at an end of the enclosure 31 adjacent its carriage 23. That chamber extends between the baffle 35 and an end baffle 43. The baffle 43 also must contain holes that are large enough to receive the support rods therethrough without any touching or scraping as the rods in the enclosure are moved with respect to each other. The chamber 41 contains another tube 45 therein having holes along its length for introducing an inert gas into the chamber 41, independent of introduction of an inert gas into the portion of the enclosure 31 in which the wafers are positioned.

An appropriate mechanism (not shown) within the elongated frame 11 is driven by a controlled motor source (not shown) to independently move the carriages 21 and 23 along essentially the full length of the frame 11 between its ends 13 and 17. Motor control means (not shown) are provided as part of the controller 19, preferably using current microprocessor technology. A flexible gas line 47 is provided between the controller 19 and the enclosure 31 in order to provide gas to the injector tube 37 for all positions of the enclosure 31 along the length of the frame 11. Similarly, another such flexible hose (not shown) is provided between the controller 19 and the injector 45 in the chamber 41. Gas flow is independently controlled to each of the injectors 37 and 45 by the controller 19.

The positions of support rods 25 and the enclosure 31 shown in FIG. 1 is typical for a process utilizing this system. That is the relationship of the elements that exists just prior to inserting the combination of the wafers and the enclosure 31 into the diffusion furnace 15, or after they have been removed.

Referring particularly to FIG. 2, a different position of the elements is shown, wherein the carriages 21 and 23 are positioned at their extreme positions along the frame 11 at the end 13. This is the position of the elements when processing is taking place within a processing chamber formed by a tube 49. The tube 49 is open at one end and carries sealing flange 51 at its open end. The sealing flange is designed to tightly contact a surface of the baffle 35 that is part of the enclosure 31. As is well known, such a reaction chamber has a plurality of gas input lines 53 and 55. A thermocouple element 57 within the reaction chamber monitors its temperature. The wafers within the chamber are heated by an appropriate system (not shown). The end of the reaction chamber tube 49 wherein the wafers are positioned in the illustration of FIG. 2 is the end that is heated to the high temperatures required for the vapor deposition of film on the wafers. During processing of the heated wafers, reactive gases entering the reaction chamber through ports 53 and 55 exit the chamber through the enclosure 31 at an opening 59 that is positioned outside of the reaction chamber. An enclosure 61 that is part of the diffusion furnace exhausts those gases from the furnace. The expelled reactant gases pass through the enclosure 31 and its baffle 35 at the openings that surround the rod 25. Of course, as discussed below, inert gases do not flow into the enclosure 31 during the processing operation.

In order to completely seal the openings in the baffle 43 through which the rods 25 pass, a sealing element 63 is carried by each of the rods 25. The seal 63 is free to move along the length of the rod a distance constrained by a bellows resilient element 65 that is attached by a ring 67 to the rod. This seal is effected only when the wafers are fully within the reaction chamber 49, as shown in FIG. 2. The seal 63 is positioned along the length of the rod so that it automatically abuts against the outside of the baffle 43 when the support rods 25 and the enclosure 31 are in their processing position shown in FIG. 2.

The function of the various elements of the system described above with respect to FIGS. 1 and 2 will be better appreciated from the following description of an example method that is carried out using that system. The example method is illustrated in twelve steps of FIGS. 3(A) through FIG. 3(L), in sequence. The example process chosen to be described is a very complete one, it being understood that variations in this process can readily be made, particularly the elimination of some steps that are unnecessary for certain applications. Further, the illustrations of FIG. 3 do not show the system with all of the details previously illustrated in FIGS. 1 and 2, but it will be understood that it is that previously described detailed structure that is employed in the example process shown in FIG. 3.

A first step of FIG. 3(A) shows the carriages 21 and 23 in their extreme position adjacent an end 17 of the frame 11. In this position the wafer carrying portion of the length of the rods 25 extends outside of the enclosure 31. In this position, boats of wafers are loaded on the support rods 25, as is the end baffle 39. There is no inert gas flow into the enclosure 31, but there is a low flow of an inert gas that is started in the reactor tube 49, being introduced through one of its gas inlet ports 53 or 55.

In the next step shown in FIG. 3(B), the enclosure 31 is moved over the wafers 29 by moving the carriage 23 to a middle position along the length of the frame 11. As this movement is taking place, inert gas flow into the small chamber 41 is initiated through the injector 45.

FIG. 3(C) shows the initial entry of the wafers and their surrounding enclosure into the reaction chamber 49 by movement of the carriages 21 and 23 together. During the time of this movement, inert gas flow through the injector 37 is commenced.

FIG. 3(D) shows the enclosure 31 fully inserted into the reaction chamber 49. In this position, the enclosure baffle 35 fully engages the sealing ring 51 at the end of the reactor tube 49, as best shown in FIG. 2.

The next step is for the carriage 21 to be moved further toward the reaction chamber, as shown being done in FIG. 3(E). This motion pushes the wafers outside of their protective enclosure 31 since the wafers are now fully within the reaction chamber 49 which has been partially sealed. When the system is in about this position, the inert gas flow into the reaction chamber 49 is switched from a low flow maintained in the previous steps to a much higher flow. Of course, the purpose of the inert gas flow is to keep the wafers in an atmosphere that does not contain oxygen, or particulate material.

FIG. 3(F) shows the wafers fully inserted into the reaction tube 49. It is at this position that the openings in the baffle 43, through which inert gas has been escaping in the previous steps, are sealed by the seal 63, as best shown in FIG. 2. Since it is sealed, the nitrogen flow into the small chamber 41 through the injector 45 is terminated. The nitrogen flow through the injectors 37 may, optionally, be turned off at this time. Inert gas remains flowing at a high rate into the reaction chamber 49 through its own gas inlet port.

FIG. 3(G) shows the elements of the system unchanged from the previous step of FIG. 3(F). But what has happened between those steps, in time, is the termination of all remaining inert gas flow and commencement of the flow of processing gases into the reaction chamber 49 through its gas inlet ports. The insertion of the wafers into the reaction chamber as shown in FIGS. 3(C) through 3(F) takes place very slowly so that the wafers are not heated so fast that they crack. At the step of FIG. 3(G), the wafers are at their processing temperature. The temperature rise has taken place with the wafers in a very protective, inert atmosphere.

After the appropriate processing within the reaction chamber 49, the wafer support rods 25 are slowly moved in order to pull the wafers back within their protective enclosure 31. This is shown in FIG. 3(H). Prior to breaking the seal of the opening in the baffle 43 by the seal 63, an inert gas begins to flow through the injector 45 into the chamber 41. This will then keep air from moving into that chamber through the unsealed openings. At about the same time, an inert gas flow is recommenced through the injector 37 into the main portion of the enclosure 31. Also, at this time, a high flow of inert gas is recommenced to the reaction chamber 49 through one of its own inlet ports.

FIG. 3(I) shows the wafers retracted within the chamber 31. That chamber has not yet been moved. Since the wafers are now out of the hot zone of the reaction tube 49, they begin to cool. The withdrawal of the wafers occurs slowly enough that substantial cooling does occur. Of course, the cooler the wafers become, the less chance of an undesired reaction with oxygen.

In the step illustrated in FIG. 3(J) the wafers and enclosure 31 are moved together out of the reaction chamber 49. At this time, the inert gas flow into the reaction chamber 49 has been reduced to a low level. Also, the inert gas flow into the chamber 41 through the injector 45 can be reduced to a low flow. The flow of inert gas to the injector 37 remains at its previous level.

In the step illustrated in FIG. 3(K), the wafers and their protective enclosure are fully withdrawn from the reaction chamber 49. Flow of inert gas through the injector 37 is maintained, but that through the injector 45 is turned off.

In order to allow access for removal of the wafers by hand, the protective enclosure 31 is moved with respect to the support rods 25 to result in the wafers being exposed as shown in FIG. 3(L). At this time, the process is complete and the nitrogen flow through the injector 37 is turned off.

Although the various aspects of the present invention have been described with respect to a preferred embodiment thereof, it will be understood that the invention is entitled to protection within the full scope of the appended claims It is claimed:

1. A method of moving articles into and out of an open end of a processing chamber, comprising the steps of:

loading the articles onto an elongated cantilevered support outside of said processing chamber, providing relative motion between a cantilevered enclosure that surrounds said support and the elongated support such that the articles are surrounded by the enclosure, moving the support and enclosure together into an end of the processing chamber in a manner that said enclosure is sealed against an open end of the processing chamber, providing relative motion between the elongated support and the enclosure such that the articles are positioned outside of said enclosure while within said processing chamber, conducting the processing of the articles within the processing chamber with the articles positioned outside of said enclosure, said processing including heating of the articles, after such processing, providing relative motion between the elongated support and the enclosure in a manner to reposition the articles within said enclosure, removing the article support and enclosure together from said end of the processing chamber, and providing relative motion between the elongated support and the enclosure such that the articles are positioned outside of said enclosure, whereby the processed articles may be unloaded off of the support.

2. A method according to claim 1 which comprises the additional steps of:
providing a flow of an inert gas into said enclosure before the articles and the enclosure have been moved into the processing chamber,
terminating the inert gas flow during processing,
reestablishing a flow of an inert gas into said enclosure after processing of the articles but before the articles and the enclosure have been removed from the processing chamber, and
maintaining the inert gas flow of a sufficient amount and time in order to allow the articles to substantially return to ambient conditions only within an atmosphere of the inert gas.

3. A method according to claim 1 wherein the articles are semi-conductor wafers, and the processing chamber includes a hot processing zone removed a distance from said end, wherein the step of providing relative motion between the elongated cantilever support and the enclosure in order to position the articles outside of the enclosure includes positioning the enclosure within the processing chamber at said end.

4. A method of moving articles into and out of an open end of a processing chamber, comprising the steps of:
loading articles to be processed on an elongated cantilevered support outside of said processing chamber,
providing relative motion between a cantilevered enclosure that surrounds said support and the elongated support such that the articles are surrounded by the enclosure,
providing a flow of an inert gas into said enclosure sufficient to push substantially all other gases out of the enclosure,
moving the support and enclosure together into an open end of the processing chamber,
providing relative motion between the elongated support and the enclosure in order to position the articles outside of the enclosure but remaining within said processing chamber,
terminating the inert gas flow into said enclosure,
conducting the processing of the articles within the processing chamber,
reestablishing a flow of inert gas into said enclosure,
after completion of said processing, providing relative motion between the elongated support and the enclosure in a manner to reposition the articles within the enclosure,
removing the article support and enclosure together from said open end of the processing chamber,
terminating the flow of inert gas into the enclosure after the articles have substantially returned to ambient conditions outside of said processing chamber,
providing relative motion between the elongated support and the enclosure such that the articles are positioned outside of said enclosure, whereby the processed articles may be unloaded off of the support, and
unloading the processed articles from the elongated cantilevered support.

5. A method according to claim 4 wherein the articles are semi-conductor wafers, and the processing chamber includes a hot processing zone removed a distance from said end, wherein the step of providing relative motion between the elongated cantilever support and the enclosure in order to position the articles outside of the enclosure includes positioning the enclosure within the processing chamber at said end.

6. A method according to claim 4 wherein:
the step of providing relative motion between the cantilevered enclosure that surrounds said support and the elongated cantilever support such that the articles are surrounded by said enclosure includes moving the enclosure to a position where it surrounds said articles while the article support remains stationary,
the step of providing relative motion between said support and said enclosure such that the article support is positioned outside of the enclosure and further into the processing chamber includes moving the article support to a position outside of said enclosure while the enclosure remains stationary,
the step providing relative motion between the article support and the enclosure in a manner to reposition the articles within the enclosure includes moving the article support to a position within the enclosure while the enclosure remains stationary, and
the step of providing relative motion between the elongated support and the enclosure such that the articles will be positioned outside of said enclosure, whereby the processed articles may be unloaded off of the support includes moving the enclosure to a position where it no longer surrounds said articles while the article support remains stationary.

7. A method according to claim 4 which comprises the additional steps of:
providing a flow of inert gas into a partitioned chamber at the end of said surrounding enclosure furthest from said processing chamber during the relative motion between the enclosure and the article support by which the articles will be substantially enclosed,
maintaining the flow of an inert gas into said partitioned chamber at least until a seal for the partitioned chamber is positioned against it, at which time said article support is positioned within the processing chamber and outside said surrounding enclosure,
terminating the inert gas flow during processing,
reestablishing the inert gas flow into said partitioned chamber after processing but before the seal for the partitioned chamber is broken when the article support is beginning to be repositioned within said surrounding chamber, and
terminating the inert gas flow after said support and said enclosure have been removed from the processing chamber.

8. A method of moving semi-conductor wafers into and out of a hot zone of a processing chamber through an open end of the chamber, comprising the steps of:
loading wafers to be processed on an elongated cantilevered support outside of said processing chamber,
providing relative motion between a cantilevered enclosure that surrounds said support and the elongated cantilevered support such that the wafers will be surrounded by said enclosure,
thereafter, providing a flow of an inert gas into said enclosure sufficient to push substantially all particles and other gases out of the enclosure,
moving the support and enclosure together into the open end of the processing chamber, providing relative motion between said wafer support and said enclosure in order to position the wafers outside of the enclosure into the hot zone of the processing chamber and to maintain the enclosure at the end of the processing chamber, terminating the inert gas flow into said enclosure, conducting the processing of the wafers within the processing chamber hot zone, after completion of said processing, reestablishing a flow of inert gas into said enclosure, thereafter, providing relative motion between the wafer support and said enclosure in a manner to reposition the wafers within the enclosure, removing the wafer support and enclosure together from said open end of the processing chamber, terminating the flow of inert gas into the enclosure after the wafers have substantially returned to ambient conditions outside of said processing chamber, and providing relative motion between the elongated support and the enclosure such that the wafers will be positioned outside of said enclosure, whereby the processed wafers may be unloaded off of the support, unloading the processed wafers from the elongated cantilevered support.

9. A method according to claim 8 wherein:

the step of providing relative motion between the cantilevered enclosure that surrounds said support and the elongated support such that the wafers will be surrounded by said enclosure includes moving the enclosure to a position where it surrounds said wafers while the wafer support remains stationary, the step of providing relative motion between said support and said enclosure such that the wafer support is positioned outside of the enclosure and further into the processing chamber includes moving the wafer support to a position outside of said enclosure while the enclosure remains stationary, the step providing relative motion between the wafer support and the enclosure in a manner to reposition the wafers within the enclosure includes moving the wafer support to a position within the enclosure while the enclosure remains stationary, and the step of providing relative motion between the elongated support and the enclosure such that the wafers will be positioned outside of said enclosure, whereby the processed wafers may be unloaded off of the support includes moving the enclosure to a position where it no longer surrounds said wafers while the wafer support remains stationary.

10. A method according to claim 8 which comprises the additional steps of:

providing a flow of inert gas into a partitioned chamber at the end of said surrounding enclosure furthest from said processing chamber before there is relative motion between the enclosure and the wafer support by which the wafers will be substantially enclosed, maintaining the flow of an inert gas into said partitioned chamber until a seal for the partitioned chamber is positioned against it, at this time, positioning said wafer support within the hot zone of the processing chamber and outside said surrounding enclosure which positioned at the end of, but completely within the processing chamber, terminating the inert gas flow during processing, reestablishing the inert gas flow into said partitioned chamber after processing, but before the seal for the partitioned chamber is broken when the wafer support is beginning to be repositioned within said surrounding chamber, and terminating the inert gas flow after said support and said enclosure have been removed from the processing chamber.

* * * * *